(12) United States Patent
Tanase et al.

(10) Patent No.: US 7,247,984 B2
(45) Date of Patent: Jul. 24, 2007

(54) ELECTROLUMINESCENCE ELEMENT AND ELECTROLUMINESCENCE PANEL

(75) Inventors: Kenji Tanase, Mizuho (JP); Ryuji Nishikawa, Gifu (JP)

(73) Assignee: Sanyo Electric Co., Ltd. (JP)

( * ) Notice: Subject to any disclaimer, the term of this patent is extended or adjusted under 35 U.S.C. 154(b) by 326 days.

(21) Appl. No.: 10/897,627

(22) Filed: Jul. 23, 2004

(65) Prior Publication Data

US 2005/0035710 A1 Feb. 17, 2005

(30) Foreign Application Priority Data

| Jul. 25, 2003 | (JP) | ............................. 2003-280254 |
| Nov. 28, 2003 | (JP) | ............................. 2003-400714 |

(51) Int. Cl.
  *H05B 33/02* (2006.01)
(52) U.S. Cl. ...................................... 313/506; 313/503
(58) Field of Classification Search ................ 313/503, 313/504, 505, 506
  See application file for complete search history.

(56) References Cited

U.S. PATENT DOCUMENTS

| 5,707,747 | A | 1/1998 | Tomiyama et al. |
| 5,834,894 | A | 11/1998 | Shirasaki et al. |
| 6,198,217 | B1 | 3/2001 | Suzuki et al. |
| 6,281,552 | B1 | 8/2001 | Kawasaki et al. |
| 6,475,648 | B1 | 11/2002 | Hatwar et al. |
| 6,579,629 | B1 * | 6/2003 | Raychaudhuri et al. ..... 428/690 |
| 6,660,409 | B1 | 12/2003 | Komatsu et al. |
| 6,750,609 | B2 * | 6/2004 | Aziz et al. .................. 313/506 |
| 7,071,615 | B2 * | 7/2006 | Lu et al. ..................... 313/506 |
| 2003/0129447 | A1 | 7/2003 | Madathil et al. |
| 2004/0256983 | A1 * | 12/2004 | Hung et al. ................. 313/506 |

FOREIGN PATENT DOCUMENTS

| JP | 11-162652 | 6/1999 |
| JP | 2003-123990 | 4/2003 |
| KR | 2003-0025208 | 3/2003 |

OTHER PUBLICATIONS

English Translation of Excerpts of Japanese Patent Laid-Open Publication No. Hei 11-162652.

(Continued)

*Primary Examiner*—Nimeshkumar D. Patel
*Assistant Examiner*—Matt Hodges
(74) *Attorney, Agent, or Firm*—Cantor Colburn LLP

(57) ABSTRACT

In an electroluminescence element, a layered structure is employed for an upper electrode including a first upper conductive layer formed through evaporation, a buffer layer, and a second upper conductive layer formed through sputtering. By interposing the buffer layer between the first and second upper conductive layers, damages to a light emitting element layer formed below the upper electrode and containing an organic material or the like having a low resisting characteristic against sputtering environment can be prevented while a high level of a charge injection efficiency to the light emitting element layer is maintained for charges such as electrons and holes, and, at the same time, a conductive layer can be formed with superior coverage and uniformity, to a sufficient thickness, and with superior productivity. The buffer layer may have a multi-layer structure.

29 Claims, 10 Drawing Sheets

OTHER PUBLICATIONS

Office Action for corresponding Korean patent application No. 10-2003-38626 with English excerpt.

Japanese Patent Laid-Open Publication No. 2002-25765 with its English abstract.

Office Action (mailed Apr. 13, 2006) for corresponding Korean Patent Application No. 10-2004-57474 with its excerpt English translation.

Japanese Patent Laid-Open Publication No. Hei 10-275680 with its English abstract.

Notice of Grounds for Rejection for Korean Patent Application No. 10-2004-57474 mailed Nov. 28, 2006.

* cited by examiner

COMPARATIVE EXAMPLE 1 : ITO/NPB/Alq/LiF/Al-sputtering
EXAMPLE 1 : ITO/NPB/Alq/LiF/Al-evaporation/CuPc/Al-sputtering COMPARATIVE EXAMPLE 1 : ITO/NPB/Alq/LiF/Al-sputtering
EXAMPLE 1 : ITO/NPB/Alq/LiF/Al-evaporation/CuPc/Al-sputtering COMPARATIVE EXAMPLE 1 : ITO/NPB/Alq/LiF/Al-sputtering
EXAMPLE 1 : ITO/NPB/Alq/LiF/Al-evaporation/CuPc/Al-sputtering
EXAMPLE 2 : ITO/NPB/Alq/LiF/Al-evaporation/CuPc /Alq /Al-sputtering

ELECTROLUMINESCENCE ELEMENT AND ELECTROLUMINESCENCE PANEL

CROSS-REFERENCE TO RELATED APPLICATIONS

The priority Japanese Patent Application Numbers 2003-400714 and 2003-280254 upon which this patent application is based is hereby incorporated by reference.

BACKGROUND OF THE INVENTION

1. Field of the Invention

The present invention relates to an electroluminescence (hereinafter simply referred to as "EL") element and, in particular, to an upper electrode of an EL element.

2. Description of the Related Art

An EL element is self-emissive, bright, and has a wide angle of visibility. In addition, the thickness, size, and power consumption of a display panel which uses an EL element can be reduced to a same or greater degree compared to a liquid crystal display device. Because of these characteristics, wide application of EL elements is expected in the next generation of display device and light sources and, thus, much research and development is devoted to the EL element. Among EL elements, an organic EL element which uses an organic compound as a light emitting material particularly have attracted attention because a wide range of colors can be realized through design or selection of the organic compound, which facilitates realization of a full color display.

FIG. 1 schematically shows a cross sectional structure of a typical organic EL element. As shown in FIG. 1, an organic EL element has a light emitting element layer 30 having at least one organic layer including a light emitting material layered between a lower electrode 20 and an upper electrode 60, one of which functions as an anode and the other one of which functions as a cathode. The lower electrode 20 is a transparent electrode in which, for example, a conductive transparent metal oxide such as ITO (Indium Tin Oxide) is used. In the configuration illustrated in FIG. 1, the lower electrode 20 is formed below the light emitting element layer 30 and functions as an anode. The upper electrode 60, on the other hand, functions as a cathode in the configuration illustrated in FIG. 1 and is formed above the light emitting element layer 30 as a metal electrode in which Al or the like is used.

For the light emitting element layer 30, known structures include a single layer structure of an organic compound having both a charge (hole and electron) transporting function and a light emitting function or a multi-layer structure of two, three, or more layers including a charge transport layer and a light emitting layer. In the configuration illustrated in FIG. 1, a hole transport layer 304, an emissive layer 306, and an electron transport layer 308, each of which is formed using an organic compound, and an electron injection layer 310 made of LiF or the like, provided for improving electron injection efficiency from the upper electrode 60 which functions the cathode to the electron transport layer 308, are layered, in that order, from the side of the lower electrode 20 which functions as the anode.

In an organic EL element having such a structure, holes are injected from the anode side and electrons are injected from the cathode side, the organic light emitting material in the emissive layer 306 is excited with an energy of recombination of the injected holes and electrodes, and light is emitted when the organic light emitting material returns to its ground state.

In the organic EL element of the related art as described above, when a low-molecular weight organic compound is used as an organic material which is a part of the light emitting element layer 30, each layer of the light emitting element layer 30 is formed through a vacuum evaporation method. Regarding the upper electrode 60 (which is the cathode in the illustrated configuration) to be formed over the light emitting element layer 30, a similar vacuum evaporation method is used to form the upper electrode 60 after the light emitting element layer 30 is formed.

It is known that the organic compound contained in the light emitting element layer 30 is easily degraded by exposure to moisture, oxygen, and other impurities. By consecutively forming the upper electrode 60 through evaporation after the light emitting element layer 30 is formed, it is possible to form the upper electrode 60 without breaking the vacuum environment during the formation of the light emitting element layer 30, that is, without exposing the upper surface of the light emitting element layer 30 to the external atmosphere, to thereby prevent degradation in characteristics.

There has been a problem, however, in that the film formation rate in vacuum evaporation is low, and, in particular, because the upper electrode 60 is formed to a thickness which is larger than that for the other layers, the productivity in formation of the cathode through vacuum evaporation is low.

Moreover, in general, a film formed through evaporation has low uniformity and low coverage on the formation surface. Therefore, when the upper electrode 60 which is at the uppermost layer of the organic EL element and having a large unevenness on the surface due to various steps in the lower layers is formed through evaporation, problems tend to occur in which coverage deficiency occurs at the portion corresponding to steps, to cause disconnection.

A film formed through sputtering, on the other hand, has high coverage and the sputtering achieves a high film formation rate. Therefore, the problems noted above can be resolved by forming the upper electrode 60 through sputtering. However, during formation of the upper electrode 60 through sputtering, high energy electron beams, high energy neutral atoms, high energy ionized atoms, ultraviolet rays, etc. are generated and the light emitting element layer 30 already formed below the upper electrode 60 and made of an organic material may be easily damaged. When the light emitting element layer 30 is damaged, degradation in the light emission characteristics of the organic EL element may occur such as, for example, reduction of light emission efficiency and generation of a "dark spot" which is a point of light emission deficiency.

Japanese Patent Laid-Open Publication No. Hei 11-162652 (hereinafter referred to as "Reference 1") discloses protection of the lower organic layers and improvements in the productivity by employing a two-layered structure for the upper electrode including a protection electrode layer formed through vacuum evaporation and a main electrode layer formed through sputtering, in which the main electrode layer is formed through sputtering after the protection electrode layer is formed through evaporation.

By employing, as the upper electrode to be formed above the organic layer, a two-layered structure including a layer formed through evaporation and a layer formed through sputtering as disclosed in Reference 1, it is possible to protect the organic layer to a higher degree than when a configuration in which the upper electrode 60 is directly formed above the organic layer through sputtering is employed, and to improve the productivity at the same time.

The applicants found, however, that, in reality, the light emission characteristic of the organic EL element employing such a two-layered structure can be improved only by a small degree compared to the configuration in which the upper electrode is formed directly above the organic layer through sputtering, and there are some cases in which the light emission characteristic is reduced, and therefore, the expected advantages cannot be obtained. A reason for this may be that the damages to the light emitting element layer below the protection electrode layer formed through evaporation is not sufficiently prevented.

SUMMARY OF THE INVENTION

The present invention advantageously improves both reliability and light emission characteristic of an electroluminescence element and productivity.

According to one aspect of the present invention, there is provided an electroluminescence element having a light emitting element layer containing a light emitting material between a lower electrode and an upper electrode, wherein the upper electrode comprises a first upper conductive layer formed through evaporation and a second upper conductive layer formed through sputtering, layered from a side near the light emitting element layer, and a buffer layer for protecting at least the first upper conductive layer positioned below the buffer layer is provided between the first upper conductive layer and the second upper conductive layer.

According to another aspect of the present invention, there is provided an electroluminescence element having a light emitting element layer containing a light emitting material between a lower electrode and an upper electrode, wherein a charge injection layer is formed on a side of the light emitting element layer near a contact interface with the upper electrode, the upper electrode comprises a first upper conductive layer formed through evaporation and a second upper conductive layer formed through sputtering, layered from a side near the charge injection layer of the light emitting element layer, and a buffer layer for protecting at least the first upper conductive layer positioned below the buffer layer is provided between the first upper conductive layer and the second upper conductive layer.

According to another aspect of the present invention, it is preferable that, in the electroluminescence element, the buffer layer is an evaporated layer of an organic thin film.

According to another aspect of the present invention, it is preferable that, in the electroluminescence element, the charge injection layer is an electron injection layer for lowering an electron injection barrier, the first upper conductive layer contains a metal material, the buffer layer is an evaporated layer of an organic material containing an organic metal complex compound, and the second upper conductive layer contains a metal material.

According to another aspect of the present invention, it is preferable that, in the electroluminescence element, the charge injection layer is an electron injection layer for lowering an election injection barrier, the first upper conductive layer is an optically semi-transmissive metal layer, the buffer layer is an evaporated layer of an organic material containing an organic metal complex compound, and the second upper conductive layer contains a transparent conductive metal oxide material.

According to another aspect of the present invention, it is preferable that, in the electroluminescence element, the buffer layer has a distortion buffering function for preventing transfer of a distortion which occurs in the second upper conductive layer to the first upper conductive layer.

According to another aspect of the present invention, it is preferable that, in the electroluminescence element, the first upper conductive layer has a co-evaporated region of a metal material and an electron injection material used in an electron injection layer of the light emitting element layer, at least on a side of the first upper conductive layer near the light emitting element layer.

According to another aspect of the present invention, it is preferable that, in the electroluminescence element, the buffer layer has a multi-layered structure comprising a plurality of evaporated layers of organic materials including an organic metal complex compound.

According to another aspect of the present invention, it is preferable that, in the electroluminescence element, the buffer layer has a multi-layer structure, each of which is an evaporated layer, wherein a buffer material of at least one layer in the multi-layer structure differs from a buffer material of the other layers.

The multi-layer structured buffer layer may have a configuration, for example, in which a second buffer layer is provided between a first buffer layer and the second upper conductive layer wherein a material of the second buffer layer has a higher moisture resistance than a material of the first buffer layer.

According to another aspect of the present invention, there is provided an electroluminescence panel comprising a plurality of electroluminescence elements in a display region, each of the electroluminescence elements having a light emitting element layer containing a light emitting material between a lower electrode and an upper electrode, wherein the upper electrode of the electroluminescence element comprises a first upper conductive layer formed through evaporation and a second upper conductive layer formed through sputtering, layered from a side near the light emitting element layer; a buffer layer is provided between the first upper conductive layer and the second upper conductive layer; each layer of the upper electrode is formed covering an end portion of the light emitting element layer and extending to a position external to the position of the light emitting element layer in a periphery portion of the display region; and the buffer layer ends at a position internal to an ending position of the first upper conductive layer and the second upper conductive layer so that the first upper conductive layer and the second upper conductive layer directly contact each other near the ending position.

According to another aspect of the present invention, it is preferable that, in the electroluminescence panel, the buffer layer is an evaporated layer having a material resistant to sputtering or plasma.

According to another aspect of the present invention, it is preferable that, in the electroluminescence panel, the buffer layer has a multi-layer structure of a plurality of layers, wherein a buffer material of at least one layer in the multi-layer structure differs from a buffer material of the other layers.

According to another aspect of the present invention, it is preferable that, in the electroluminescence element or in the electroluminescence panel, the buffer layer comprises a first buffer layer containing a copper phthalocyanine complex derivative compound and a second buffer layer containing an aluminum-quinolinol complex derivative compound. The second buffer layer maybe formed between the first buffer layer and the second upper conductive layer and the second buffer layer may extend to a position external to an ending position of the first buffer layer at a periphery of the display region to cover an end portion of the first buffer layer.

According to another aspect of the present invention, it is preferable that, in the electroluminescence element or in the electroluminescence panel, the first upper conductive layer and the second upper conductive layer contain aluminum and the buffer layer contains a copper phthalocyanine complex derivative compound.

The light emitting element layer may have a layer containing a benzidine derivative compound having a hole transport functionality.

According to the present invention, by forming the upper electrode with a layered structure of a first upper conductive layer formed through evaporation, a buffer layer, and a second upper conductive layer formed through sputtering as described, it is possible to improve the injection efficiency of charges, such as electrons and holes, to the light emitting element layer, and to form a conductive layer with superior coverage and uniformity, in sufficient thickness, and with superior productivity without causing damages to the light emitting element layer having an organic material or the like which has a low resistance to the sputtering environment. Therefore, it is possible to improve the reliability and light emission characteristic of the electroluminescence element and, at the same time, improve the productivity.

In addition, it is also possible to provide a distortion buffering functionality to the buffer layer to buffer a distortion between the first upper conductive layer and the second upper conductive layer such as, for example, deformation, that is, a hillock in an Al layer or the like caused by a hillock occurring in another Al layer or the like, or stress generated between different metal layers. With this functionality, it is possible to further improve the reliability of the element.

It is also possible to employ a multi-layered structure for the buffer layer using different material in different layers to allow improvements in the function of the multi-layer structured buffer layer as a whole through a combination of different materials. It is possible, for example, to use a material having a high sputtering resistance or a high plasma resistance as a first buffer layer and forming a second buffer layer between the first buffer layer and the second upper conductive layer using a material having a high moisture resistance. With such a structure, even when the moisture resisting capability of the first buffer layer is lower than that of the second upper conductive layer, by forming the second buffer layer having a high moisture resistance between the first buffer layer and the second upper conductive layer, it is possible to improve not only the sputtering or plasma resistance, but also the moisture resistance within the buffer layer as a whole.

In a panel having an electroluminescence element having an upper electrode as in the present invention, by covering the end portion of the light emitting element layer at the periphery of the panel with the upper electrode, it is possible to reliably prevent intrusion of moisture or the like from near the panel periphery to the inside of the light emitting element layer. In particular, by ensuring that the buffer layer of the upper electrode extends only to a position inside the end position of the first upper conductive layer and the second upper conductive layer, to thereby form a region in which the first upper conductive layer and the second upper conductive layer directly contact each other, it is possible to reduce the resistance as the upper electrode.

DESCRIPTION OF PREFERRED EMBODIMENTS

Figure 1:
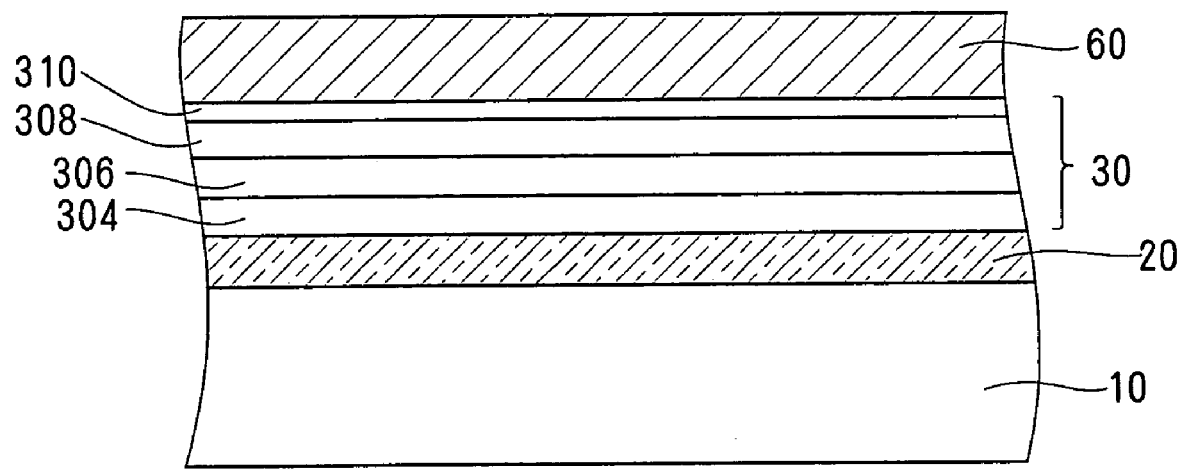
FIG. 1 is a cross sectional view schematically showing an organic EL element of a related art.

Preferred embodiments of the present invention (hereinafter simply referred to as "embodiments") will now be described referring to the drawings.

[Overall Structure]

Figure 2:
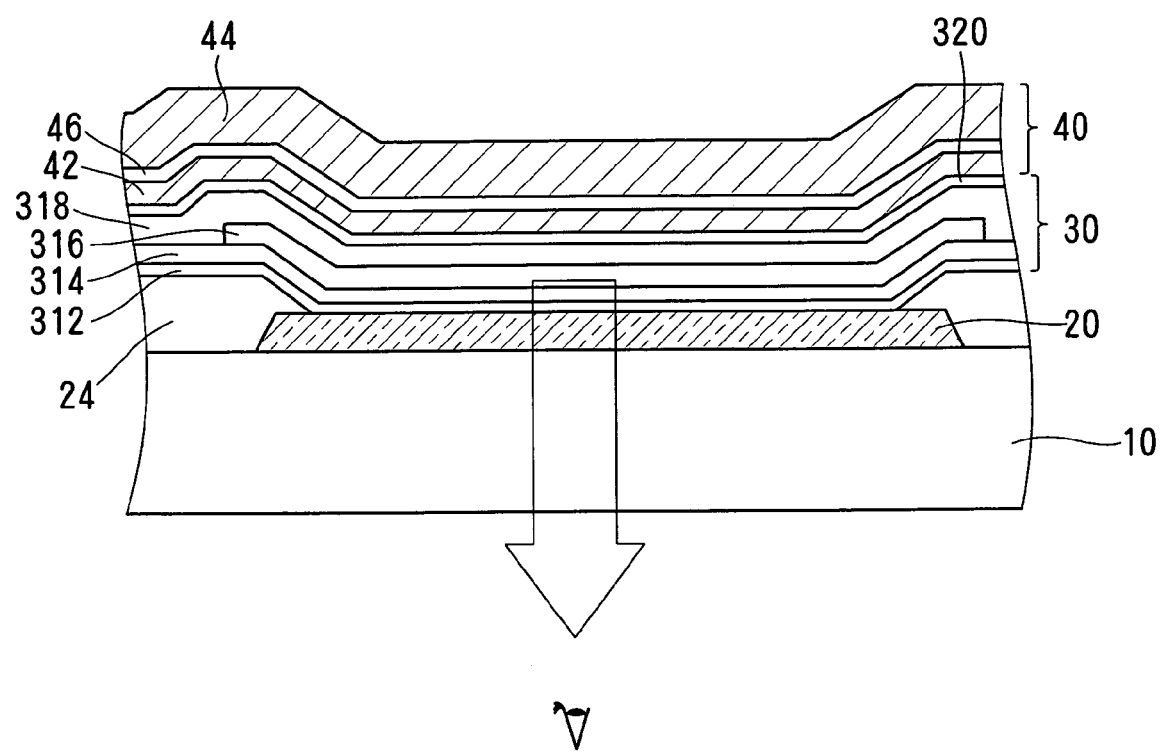
FIG. 2 is a diagram schematically showing a cross sectional structure of an electroluminescence element according to a preferred embodiment of the present invention.

FIG. 2 schematically shows a cross sectional structure of an electroluminescence element according to an embodiment of the present invention. This electroluminescence element comprises a light emitting element layer 30 having at least one layer containing a light emitting material between a lower electrode 20 and an upper electrode 40 formed above a transparent substrate 10 made of, for example, glass or plastic.

The lower electrode 20 formed below the light emitting element layer 30, is a transparent electrode obtained by, for example, sputtering a conductive transparent metal oxide such as ITO (Indium Tin Oxide) and patterning the film into a predetermined shape, and functions as an anode, similar to the structure of FIG. 1. The upper electrode 40, on the other hand, functions as a cathode in the illustrated structure of FIG. 2, is formed above the light emitting element layer 30, and has a layered structure as will be described later. An optically reflective (non-transparent) metal material is used as a primary constituent of the upper electrode 40 in the illustrated structure of FIG. 2.

In the light emitting element layer 30, a single layer structure containing an organic compound having both a charge (hole or electron) transport functionality and light emitting functionality may be employed, or, alternatively, a multi-layered structure of two, three, or more layers including a charge transport layer and an emissive layer may be employed. In the illustrated configuration of FIG. 2, a first hole transport layer 312, a second hole transport layer 314, an emissive layer 316, and an electron transport layer 318, each of which is formed using an organic compound, and an electron injection layer 320 for lowering an electron injection barrier from the upper electrode 40 which functions as the cathode to the side of the electron transport layer 318 to improve electron injection efficiency are layered in that order from the side of the lower electrode 20 which functions as the anode. Each layer of the light emitting element layer 30 is an evaporated layer formed through vacuum evaporation. Regarding each of the first hole transport layer 312, the second hole transport layer 314, the emissive layer 316, and the electron transport layer 318, when the organic compound used in each layer is a low-molecular weight compound, these layers are formed through vacuum evaporation. However, when a high-molecular weight compound is used, these layers may be formed through methods such as, for example, ink jet printing, or spin coating. For the electron injection layer 320 formed at the interface of the light emitting element layer 30 with the upper electrode 40, lithium fluoride (LiF) or the like is typically used and vacuum evaporation is typically employed for formation of this layer. Regardless of the formation method, the light emitting element layer 30 contains an organic compound and is formed by soft films compared to the metal film and inorganic insulating film formed through, for example, sputtering.

In the present embodiment, the upper electrode 40 formed above the light emitting element layer 30 comprises a first upper conductive layer 42 formed through evaporation and a second upper conductive layer 44 formed through sputtering. In addition, the upper electrode 40 further comprises a buffer layer 46 between the first upper conductive layer 42 and the second upper conductive layer 44 for protecting the layers below the second upper conductive layer 44, that is, in the illustrated structure, the first upper conductive layer 42 and the light emitting element layer 30 below the first upper conductive layer 42.

More specifically, above an electron injection layer 320, which is made of LiF, of the light emitting element layer 30, an Al layer (Al evaporated layer) having a thickness of approximately 5 nm-50 nm, in an example configuration, 10 nm is formed as the first upper conductive layer 42 through vacuum evaporation consecutively after the electron injection layer 320 is formed.

Above the first upper conductive layer 42, an organic layer containing CuPc (copper phthalocyanine complex) is formed to a thickness of approximately 5 nm-50 nm, in an example configuration, 10 nm, as the buffer layer 46 through vacuum evaporation consecutively after the first upper conductive layer 42 is formed.

Above the buffer layer 46, a metal layer of, for example, Al, an Al alloy, a refractory metal material such as Mo, Ti, and Cr or, an alloy of the refractory metal, is formed to a thickness of approximately 0.2 nm-400 nm, in an example configuration, 300 nm, as the second upper conductive layer 44 through sputtering. In the present embodiment, an Al layer is used as the second upper conductive layer 44.

The thickness of each layer of the upper electrode 40 is not limited to those described above, but, because the first upper conductive layer 42 is formed through evaporation, if the thickness of the first upper conductive layer 42 is to be a thick thickness, the productivity cannot be improved, and, on the other hand, if the thickness of the first upper conductive layer 42 is to be a thin thickness, the layer cannot be uniformly formed over the necessary region due to the low coverage and flatness of the evaporated film. Therefore, it is preferable that the first upper conductive layer 42 be formed at least to a thickness which allows for reliable injection of electrons to the electron injection layer 320 as will be described, for example, in a range approximately between 5 nm and 50 nm as described above.

The buffer layer 46 is preferably formed, for example, through vacuum evaporation in order to prevent damages to layers below the buffer layer 46. Therefore, it is preferable to form the buffer layer 46 to a thickness of approximately 5 nm to 50 nm as described above, which is sufficiently thick so that functions such as protection of the lower layers as will be described below can be realized, and, at the same time, is sufficiently thin to not reduce the productivity, to maintain a moderate level of increase in the resistance of the upper electrode 40 as a whole, and to maintain the electron injection functionality.

The second upper conductive layer 44 is formed through sputtering, and therefore, it is possible to form a relatively thick layer having high coverage and uniformity with high productivity. It is preferable that the thickness of the second upper conductive layer 44 be set to a thickness necessary for preventing occurrence of disconnection and concentration of electric field as an electrode and which allows reduction of the resistance of the electrode as a whole to thereby allow reduction of heat generation and of a voltage drop. The set range of the thickness may be, for example, approximately 0.2 nm-400 nm, but the thickness may be increased or decreased depending on the properties of the metal material to be used.

In addition to the function of the buffer layer 46 to protect lower layers during sputtering of the second upper conductive layer 44, it is necessary that the light emitting element layer 30 positioned below the buffer layer 46 is not damaged during formation of the buffer layer 46. Therefore, it is desirable to use a material which allows a layer to be formed through vacuum evaporation which is less likely to damage the lower layers. In addition, because the buffer layer 46 is required to have a function for protecting the lower layers from plasma environment, etc., during sputtering, it is desirable that the buffer layer 46 is a dense and relatively stable film so that the buffer layer 46 is not removed or is only partially removed during sputtering. As a material satisfying this condition, it is desirable to use CuPc as described above which is an organic metal complex, and, in particular, is a chelated complex compound, used as a material of the hole injection layer of the light emitting element layer 30, and which allows for dense and stable evaporated thin film. In addition to CuPc, it is also possible to use aluminum-quinolinol complex derivative such as $Alq_3$ (aluminum 8-quinolinol trimer complex derivative) which has an electron transport function and which is similarly a chelated complex compound. As will be described later, the buffer layer may be of a simple layer structure or a multi-layered structure.

In a structure in which an Al layer is used as the second upper conductive layer 44 and the first upper conductive layer 42, if the conductive layers 42 and 44 are directly in contact with each other, when a hillock, that is, deformation (distortion) of film, unique to the Al layer of the second upper conductive layer 44 positioned at the uppermost layer occurs, deformation or stress (distortion) occurs in the interface between the first upper conductive layer 42 and the electron injection layer 320 due to the hillock of the second upper conductive layer 44. In an organic EL element, improvement of electron injection efficiency from the cathode to the light emitting element layer 30 is important also from a viewpoint of improving the light emission efficiency of the element, and therefore it is necessary to prevent occurrence of distortion such as unevenness and stress at the interface between the cathode and the light emitting element layer 30 due to the hillock.

Regarding distortion, in the present embodiment, a buffer layer 46 which is made of an organic material is provided between the second upper conductive layer 44 and the first upper conductive layer 42 as described above. This organic buffer layer is relatively soft compared to the metal layer and inorganic protection layer formed through sputtering or the like, and can realize a function to buffer stress, that is, buffer distortion. Therefore, by interposing the buffer layer 46 between the first upper conductive layer 42 and the second upper conductive layer 44, it is possible to prevent transfer of hillocks occurring in the second upper conductive layer 44 to the first upper conductive layer 42, to consequently prevent occurrence of hillocks and deformations in the first upper conductive layer 42.

The buffer layer 46 made of an organic material may also realize a buffer function of distortion due to stress, in addition to prevention of transfer of hillocks. For example, when the second upper conductive layer 44 is formed through sputtering of a refractory metal material such as Mo directly on the first upper conductive layer 42 which is an Al evaporated layer, stress is generated between the first upper conductive layer 42 and the second upper conductive layer 44 which is dense compared to the evaporated Al layer and which has a high thermal expansion coefficient and a high amount of heat generation when the element is driven. However, by interposing, between the second upper conductive layer 44 and the first upper conductive layer 42, the buffer layer 46 which is relatively soft compared to the second upper conductive layer 44, it is possible to buffer this stress.

As the organic material to be used for the buffer layer 46, it is desirable to use a metal complex as described above, and, in particular, to use a metal complex having some degree of charge transport (injection) functionality. In the present embodiment, because a very thin buffer layer 46 is formed, the movement of charge (electron) from the second upper conductive layer 44 to the first upper conductive layer 42 is not significantly impeded when the buffer layer 46 is provided between the first upper conductive layer 42 and the second upper conductive layer 44, even when the buffer layer 46 does not have a charge transportability. However, with an organic material having a charge transporting functionality, it is possible to inhibit the degree of impedance of charge movement and to reduce an amount of increase in drive voltage of the element caused by the provision of the buffer layer 46, to thereby contribute to improvements in light emission efficiency of the organic EL element.

In addition, as described above, an important function of the buffer layer 46 is to protect the light emitting element layer 30 when the second upper conductive layer 44 is being formed through sputtering. In consideration of this protection function, the structure is not limited to a structure in which the buffer layer 46 is provided between the second upper conductive layer 44 and the first upper conductive layer 42, and, the buffer layer 46 may be interposed, for example, between the first upper conductive layer 42 and the electron injection layer 320 which is the uppermost layer of the light emitting element layer 30 and which is made of LiF.

The present applicants found that, when the buffer layer 46 is formed between the electron injection layer 320 and the first upper conductive layer 42, although the light emitting element layer 30 may be protected from sputtering, the light emission efficiency of the organic EL element cannot be significantly improved.

With a structure as shown in FIG. 2 in which the first upper conductive layer 42 is formed through evaporation in contact with the electron injection layer 320 and the buffer layer 46 is interposed between the first upper conductive layer 42 and the second upper conductive layer 44, it is possible to significantly improve all of the light emission efficiency, durability, and productivity of the organic EL element.

As a reason for such characteristic improvements, the influence of the interface condition between the electron injection layer 320 and the first upper conductive layer 42 may be considered. Specifically, when the electron injection layer 320 made of LiF and the first upper conductive layer 42 made of Al are consecutively formed through vacuum evaporation as shown in FIG. 2, all layers are softer than an Al layer formed through sputtering (in the illustrated structure, the second upper conductive layer 44) and it becomes easier for a mixture region of Al and LiF to be formed at the interface between the electron injection layer 320 and the first upper conductive layer 42. When such a mixture region is present, the electron injection efficiency from the first upper conductive layer 42 to the electron injection layer 320 is increased, and, as a result, the light emission efficiency of the organic EL element can be improved. Therefore, in a configuration in which the evaporated layer and the sputtered layer are to be used in the upper electrode 40 as in the present embodiment, it is desirable to form a soft evaporated layer in contact with the electron injection layer 320.

In order to further improve the electron injection efficiency from the first upper conductive layer 42 to the electron injection layer 320, the present invention is not limited to a configuration in which the electron injection layer 320 made of LiF and the first upper conductive layer 42 made of an Al layer are consecutively formed as independent layers, and it is possible to employ a mixture layer of LiF and Al in a predetermined mixture ratio, formed through co-evaporation. Alternatively, it is also possible to provide a concentration gradient along the thickness direction of the layer. For example, it is possible to form, after the electron transport layer 318 is formed, an electron injection layer having 100% LiF by heating an LiF source in an evaporation chamber, and then, increase an amount of evaporation of Al by heating the Al source while decreasing the amount of evaporation in the LiF source, to realize a layer with concentration gradient in which the concentration of LiF decreases from 100% to 0% and the concentration of Al correspondingly increases from 0% to 100%, that is, from a region of 100% LiF to a region of 50% LiF and 50% Al and further to a region of 100% Al, along the thickness direction of the layer. In this manner, by employing a co-evaporated region with LiF in the first upper conductive layer 42 in the entire layer or at least in the interface region with the electron injection layer 320 to form a region in which LiF and Al are mixed, it is possible to further improve the electron injection efficiency from the upper electrode 40 to the light emitting element layer 30.

In an organic EL element having a structure as described above, holes are injected from the anode side, electrons are injected from the cathode side, an organic light emitting material in the emissive layer 316 is excited by the energy of recombination of the injected holes and electrons, and light is emitted when the organic light emitting material returns to its ground state. In the organic EL element shown in FIG. 2, because an optically reflective (non-transparent) metal material is used both in the first upper conductive layer 42 and in the second upper conductive layer 46 of the upper electrode 40, the light obtained in the emissive layer 316 and emitted towards the transparent electrode 20 transmits through the lower electrode 20 (light emitted towards the upper electrode 40 is reflected by the upper electrode 40 and is then emitted towards the lower electrode 20) and through the substrate 10 which is formed of transparent glass or plastic, is emitted to the outside, and is viewed.

When a light emitting display device is to be formed using an organic EL element as described above, a high resolution and high quality display can be realized in an active matrix display device in which an organic EL element and a thin film transistor (TFT) are provided in each pixel, the TFT functioning as a switching element for individually controlling light emission from the organic EL element. In such an active matrix display device, a pixel TFT for driving the organic EL element is formed between the substrate 10 and the lower electrode 20 of the organic EL element, that is, the pixel TFT is formed before the organic EL element is formed. An element or a display device as shown in FIG. 2 in which light is emitted through the substrate on the side of the lower electrode 20 of the organic EL element is called a "bottom emission" type element or display device, and, when a TFT or the like is formed in each pixel as described above, the TFT and the organic EL element are formed in a layout in such a manner to allow light from the organic EL element is emitted through the substrate 10 to the outside in a region in which the TFT is not formed.

Figure 3:
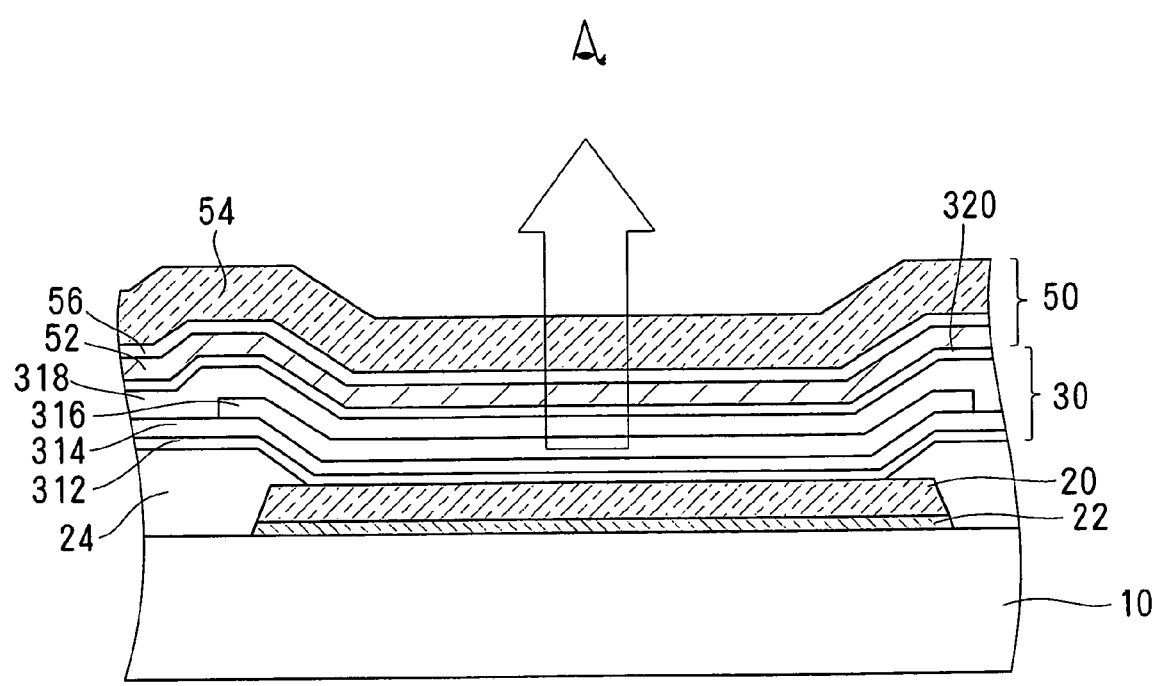
FIG. 3 is a diagram schematically showing another cross sectional structure of an electroluminescence element according to a preferred embodiment of the present invention.

FIG. 3 is a diagram showing another example structure of an electroluminescence element according to a preferred embodiment of the present invention. In the structure of the electroluminescence element shown in FIG. 2, a bottom emission type element is shown in which the upper electrode 40 is non-transparent and light is emitted through the transparent lower electrode and substrate 10. The organic EL element shown in FIG. 3, on the other hand, is a "top emission" type element in which light is emitted from the side of the upper electrode 50 to the outside. Elements identical to those in FIG. 2 are assigned the same reference numerals and will not be described in detail.

Similar to the structure of FIG. 2, a lower electrode 20 which functions as an anode and which is made of a conductive metal oxide material such as ITO is formed above a substrate 10 (in an active matrix display device, after the TFT is formed) and a light emitting element layer 30 is formed above the lower electrode 20. As the uppermost layer (the side near the upper electrode 50) of the light emitting element layer 30, an electron injection layer 320 made of Li, LiF, Li$_2$O, Cs, Mg—Ag, or the like is formed. Above the electron injection layer 320, an optically transparent upper electrode 50 which functions as a cathode is formed. The upper electrode 50 comprises a first upper conductive layer 52 formed through evaporation and a second upper conductive layer 54 formed through sputtering, layered from the side near the light emitting element layer 30. In addition, a buffer layer 56 made of CuPc or Alq$_3$ similar to the element shown in FIG. 2 is formed between the first upper conductive layer 52 and the second upper conductive layer 54.

In the first upper conductive layer 52 formed on the side near the contact interface with the electron injection layer 320, a metal material having a low work function is used in order to inject electrons into the light emitting element layer 30. As the metal material, for example, Ag or an Ag alloy (for example, Mg—Ag alloy), Au, Bi, or the like may be employed. However, because it is necessary to emit light through the upper electrode 50 to the outside, the first upper conductive layer 52 is a semi-transmissive conductive layer which allows transmission of light, though in a lower degree than a transparent electrode material such as, for example, ITO, either by forming the first upper conductive layer in a thin thickness to allow transmission of light from the emissive layer 316 or by forming the first upper conductive layer in a pattern having openings in a matrix form or in a mesh form. The buffer layer 56 is formed over the first upper conductive layer 52 and the second upper conductive layer 54 which is transparent and is made of a conductive metal oxide such as ITO and IZO (Indium Zinc Oxide) is formed over the buffer layer 56. The thicknesses of each layer of the upper electrode 50 may be set to similar values as in each layer of the upper electrode 40 described above regarding FIG. 2. For example, the thickness of the first upper conductive layer 52 made of an Ag layer through evaporation may be set to approximately 20 nm, the thickness of the buffer layer 56 made of a CuPc layer through evaporation may be set to approximately 10 nm, and the thickness of the second upper conductive layer 54 made of ITO may be set to approximately 80 nm-100 nm.

With such a structure, it is possible to form the transparent, second upper conductive layer 54 at the uppermost layer to a necessary thickness while protecting the light emitting element layer 30 from damage caused by sputtering, and to form a semi-transmissive metal layer made of Ag or the like, which is necessary for realizing efficient electron injection to the light emitting element layer 30, as the first upper conductive layer 52 directly in contact with the light emitting element layer 30. In addition, because it is necessary to form the first upper conductive layer 52 in a thin thickness or to provide openings to form the first upper conductive layer 52 in a semi-transmissive manner, when the upper electrode 50 is formed solely of the first upper conductive layer 52, the resistance of the electrode inevitably become high. However, by forming a transparent, second upper conductive layer 54 with a sufficient thickness above the first upper conductive layer 52 with the buffer layer 56 therebetween as shown in FIG. 3, it is possible to realize a low resistance as an electrode.

In the organic EL element shown in FIG. 3, by forming the upper electrode 50 to be optically transmissive as described above, the light obtained in the emissive layer 316 is emitted to the outside through the upper electrode 50. The light emitted towards the lower electrode 20 is emitted to the outside through the substrate 10 also on the side of the lower electrode 20 when a transparent material is used in the lower electrode 20 as described above, which allows for a display on both upper and lower surfaces. On the other hand, when an optically reflective layer 22 such as an Al layer is formed between the lower electrode 20 and the substrate 10 as shown in FIG. 3, the light emitted from the emissive layer 316 towards the lower electrode can be reflected by the reflective layer 22 below the lower electrode 20 and emitted from the side of the upper electrode 50. In such a top emission type organic EL element, even when a TFT or the like is formed in a lower layer of the element, it is possible to also use the formation region of the TFT as the emissive region (display region). By omitting the optically reflective layer 22, it is possible to emit light both from the side of the substrate and the side of the upper electrode 50, to achieve an element which can display on both sides.

Next, an example configuration of the buffer layer will be described. In the above description, a single layer structure which uses, for example, CuPc or $Alq_3$, is exemplified as the buffer layers 46 and 56 shown in FIGS. 2 and 3. The buffer layer, however, is not limited to a single layer structure, and a multi-layered structure may alternatively be employed for the buffer layer. The multi-layered structure may be a layered structure of, for example, two, three, or more layers. As materials of the buffer layer of a multi-layered structure, it is possible to use, for example, materials which have characteristics required for the buffer layer as described above, such as, a resistance to sputtering during when the second upper conductive layer is formed on the buffer layer, a high moisture resistance, and a distortion buffering functionality.

When the buffer layer has a single layer structure, it is necessary to achieve a maximum characteristic in a signal layer for all of these requirements.

When a multi-layered structure is employed, on the other hand, it is possible to easily realize different maximum characteristics in different layers, for example, in a layered structure of a buffer layer having a particularly high sputtering resistance and a buffer layer having a particularly high moisture resistance, and thus, it is possible to improve a degree of freedom of selection of materials to be used in the buffer layers while improving the functions of the multilayer structured buffer layer as a whole.

Figure 4:
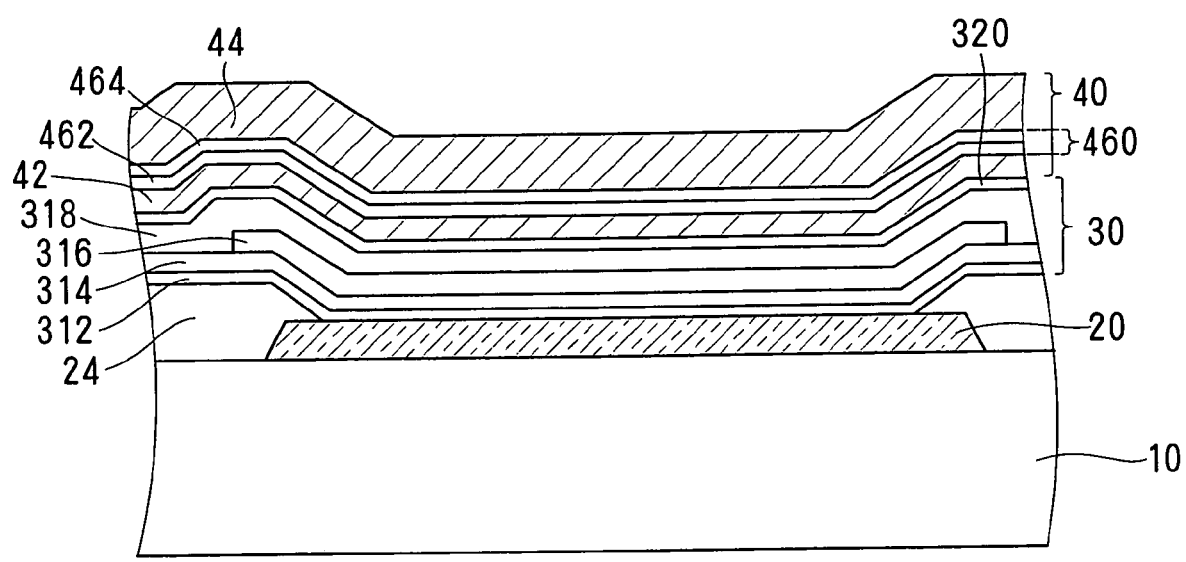
FIG. 4 is a diagram schematically showing another cross sectional structure of an electroluminescence element according to a preferred embodiment of the present invention.

FIG. 4 shows a structure of an organic EL element when a multi-layer structured buffer layer 460 is employed in a bottom emission organic EL element similar to the structure of FIG. 2. The organic EL element of FIG. 4 has a layered structure in which a lower electrode 20, a light emitting element layer 30, and an upper electrode 40 are layered in that order. The organic EL element of FIG. 4 differs from the organic EL elements of FIGS. 2 and 3 in that the buffer layer 460 formed between the first upper conductive layer 42 formed through evaporation and the second upper conductive layer 44 formed through sputtering which form a part of the upper electrode has a layered structure.

In the structure illustrated in FIG. 4, the buffer layer 460 has a two-layered structure in which a first buffer layer 462 and a second buffer layer 464 are sequentially formed through vacuum evaporation, from the side near the first upper conductive layer 42. As the materials of the buffer layers 462 and 464, it is possible to employ an organic metal complex compound such as CuPc and $Alq_3$ which can be employed as the buffer layer having a single layer structure. The material to be used and the order and number of layering are not limited, but it is desirable that the buffer layer 460 has at least a buffer layer having a superior sputtering resistance (it is also possible to use a material also having a superior moisture resistance) and a buffer layer having a superior moisture resistance (it is also possible to use a material also having a superior sputtering resistance).

In an example configuration in which CuPc which is superior in sputtering resistance is used as one layer in a plurality of layers, from the viewpoint of improvements in moisture resistance, it is desirable to form at least a buffer layer made of a material having a greater moisture resistance than CuPc on the side of a contact interface with the second upper conductive layer 44 formed through Al sputtered layer or the like, in addition to the buffer layer which uses CuPc. An example material having a greater moisture resistance than CuPc and having a buffering function is $Alq_3$ as described above.

When a buffer layer which easily absorbs moisture and a metal sputtering layer forming the second upper conductive layer 44 are in contact with each other, deformation or transformation occurs in the buffer layer due to moisture absorption and peeling of a metal sputtered layer from the buffer layer tends to occur. Therefore, by forming a buffer layer having a material with superior moisture resistance at least on the side near the interface with the metal sputtered layer, it is possible to prevent peeling of the upper layer and, consequently, intrusion of materials such as moisture and oxygen which adversely affect the light emitting element layer from the peeled portion. In other words, it is desirable to use a buffer material which is compatible with the lower layer and which has a superior moisture resistance for the buffer layer which contacts the second upper conductive layer 44.

When a single buffer layer of CuPc is used, because the CuPc layer absorbs moisture to a small degree, there is a possibility that peeling of the second upper conductive layer 44 may occur at the contact interface with the second upper conductive layer 44 made of Al or the like and formed through sputtering.

By using CuPc for the first buffer layer 462 and forming, between the first buffer layer 462 and the second upper conductive layer 44, a second buffer layer 464 in which $Alq_3$ having a greater moisture resistance than CuPc is used, it is possible to significantly improve the durability of the element. Unlike an organic EL element which uses a single buffer layer of CuPc as shown in FIGS. 2 and 3, the layered structure is not limited to a layered structure of the first buffer layer 462 in which CuPc is used and the second buffer layer 464 in which $Alq_3$ is used, layered in that order from the side near the first upper conductive layer 42, and it is also possible employ a structure of a reverse order, that is, a structure in which the first buffer layer 462 is formed using $Alq_3$ and the second buffer layer 464 is formed using CuPc, to improve the functions of the buffer layer 460. The degree of improvement in the functions, however, is greater in a layered structure of the first buffer layer 462 of CuPc and the second buffer layer 464 of $Alq_3$ as described above.

The thickness of each layer of the buffer layer 460 having a multi-layered structure must be sufficiently thin to allow for rapid formation of the buffer layer, which is formed through evaporation, and, at the same time, of sufficient thickness as necessary for maintaining coverage, flatness, and uniformity and for realizing protection function. A desirable range of the thickness of each layer is 5 nm to 50 nm. In the illustrated configuration of FIG. 4, the first buffer layer 462 made of CuPc and the second buffer layer 464 made of $Alq_3$ are both formed to a thickness of 10 nm to allow sufficient realization of necessary protection function while not reducing the productivity.

The buffer layer 460 of a layered structure is not limited to a bottom emission organic EL element, and may be applied to the buffer layer 56 of the upper electrode 50 in a top emission organic EL element shown in FIG. 3, to obtain similar advantages. For example, by forming a first buffer layer made of CuPc on the side near the first upper conducive layer 52 and a second buffer layer made of $Alq_3$ on the first buffer layer, it is possible to improve the light emission efficiency of the element and sputtering resistance and to significantly improve moisture resistance.

EVALUATION EXAMPLE

Evaluation Example 1

In Evaluation Example 1, a result of evaluation of characteristics of an organic EL element in which a sputtered layer of Al was formed as the upper electrode (Comparative Example 1) and an organic EL element (Example 1) in which a first upper conductive layer made of an evaporated layer of Al, a buffer layer made of CuPc, and a second upper conductive layer made of a sputtered layer of Al were formed as the upper electrode above a light emitting element layer. As the hole transport layer, instead of the multi-layered structure shown in FIG. 2 (the structure of FIG. 2 is not limited to a multi-layered structure), a single layer structure was employed and a benzidine derivative compound having a hole transporting function (in another representation, dimer of triphenylamine), in particular, NPB (a naphthyl-substituted benzidine derivative: N,N'(naphthalene-1-yl)-N,N'-diphenyl-benzidine) was used as the material of the single-layered hole transport layer.

The organic EL elements of Comparative Example 1 and Example 1 both had a layered structure of a lower electrode//a hole transport layer//an emissive layer//an electron injection layer//an upper electrode. In Comparative Example 1, ITO//NPB//$Alq_3$//LiF//Al (sputtered layer) were used as the materials of these layers. In Example 1, on the other hand, ITO//NPB//$Alq_3$//LiF//Al (evaporated layer)/CuPc (buffer layer)/Al (sputtered layer) were used as the materials for these layers.

Figure 5:
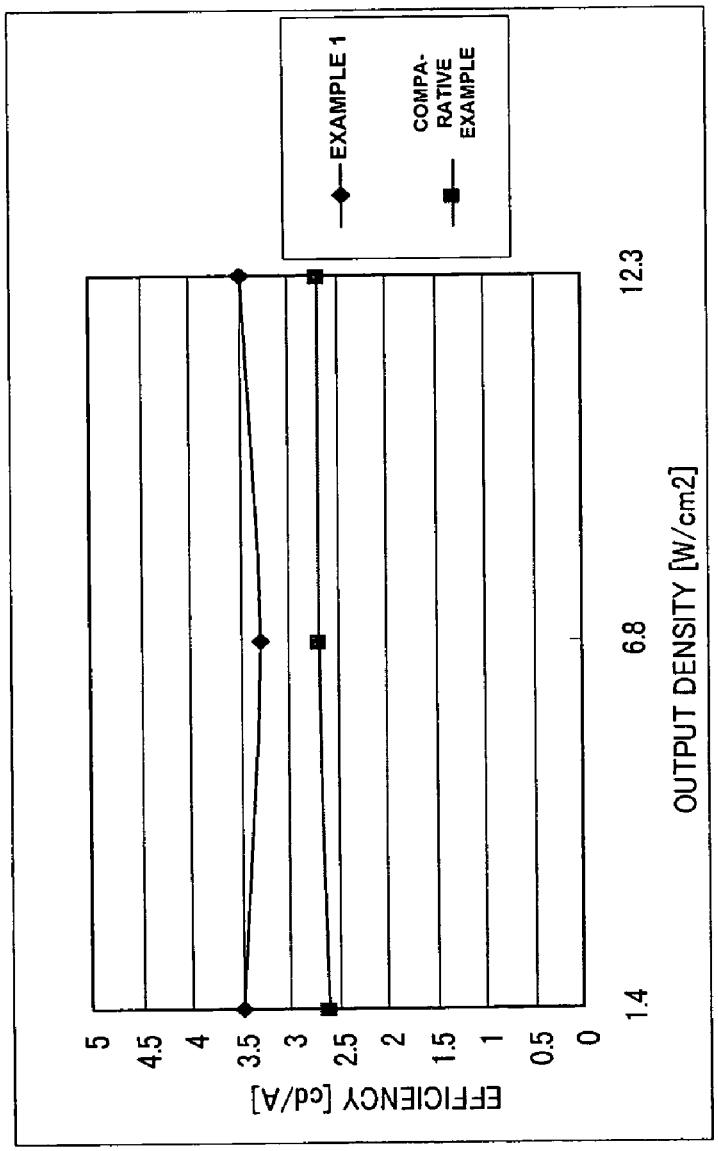
FIG. 5 is a diagram showing an evaluation of light emission efficiency with respect to an output density of an electroluminescence element according to a preferred embodiment of the present invention.

FIG. 5 shows efficiencies of organic EL elements of Comparative Example 1 and Example 1, in terms of differences in light emission efficiency (cd/A) with respect to output density (W/cm$^2$). As is clear from FIG. 5, in all configurations when, for example, the output density of electric power supplied to the organic EL element was changed, for example, between 1.4, 6.8, and 12.3, the light emission efficiency of the organic EL element of Example 1 was higher than the light emission efficiency of the organic EL element of Comparative Example 1. It can also be seen that in the element structure described above and in the range of evaluation, improvements in light emission efficiency by a factor of 1.4 times-1.2 times was achieved.

Figure 6:
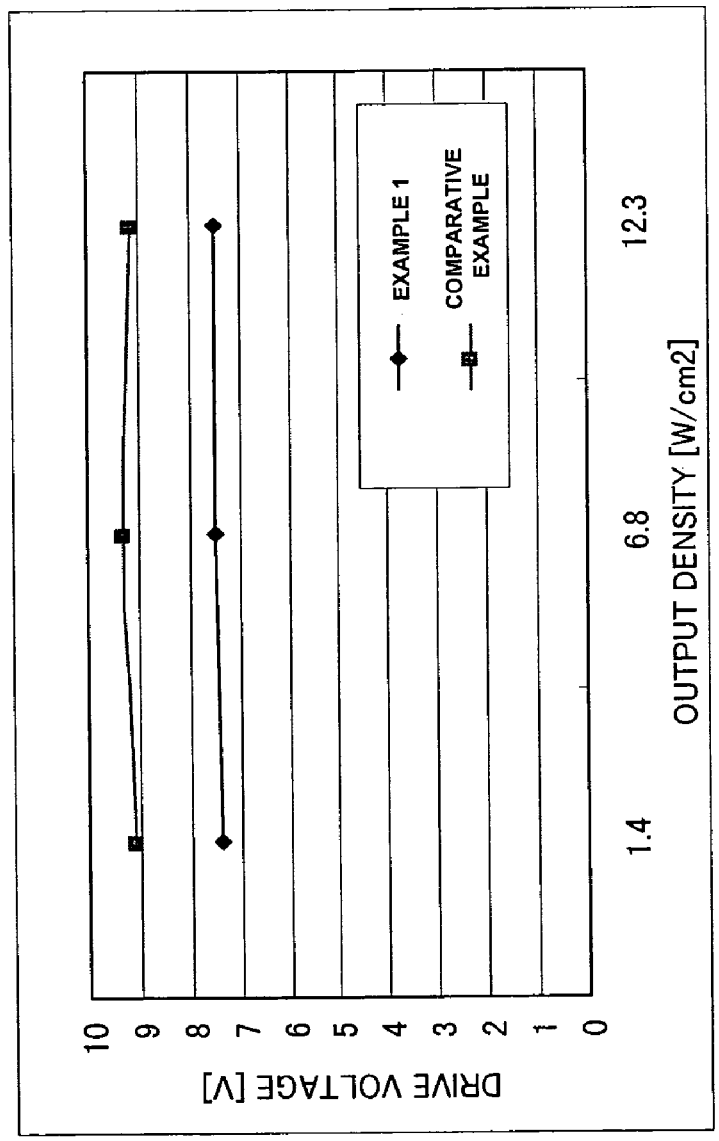
FIG. 6 is a diagram showing an evaluation of a drive voltage with respect to an output density of an electroluminescence element according to a preferred embodiment of the present invention.

FIG. 6 shows efficiencies of the organic EL elements of Comparative Example 1 and Example 1, in terms of differences in drive voltage (V) with respect to the output density (W/cm$^2$). As is clear from FIG. 6, in all configurations when the output density of electric power supplied to the organic EL element was changed, for example, between 1.4, 6.8, and 12.3, the drive voltage of the organic EL element of Example 1 was lower than the drive voltage of the organic EL element of Comparative Example 1. It can also be seen that in the element structure described above and in the range of evaluation, reduction in drive voltage to a drive voltage of 80%-82% of Comparative Example 1 was achieved.

From these results, it can be understood that, superior advantages can be obtained by using a combination of CuPc as the buffer layer and Al as the first and second upper conductive layers and that NPB can be used for the hole transport layer.

Evaluation Example 2

In Evaluation Example 2, stability (reliability) of elements was evaluated for the element of Comparative Example 1 (sputtered layer of Al was directly layered on the light emitting element layer), the element of Example 1 (single-layered buffer layer), and an element in which a buffer layer of a multi-layered structure as shown in FIG. 4 was employed (Example 2).

The element structure and used materials in Comparative example 1 and Example 1 were described above regarding Evaluation Example 1. In the element of Example 2, the element structure was similar to that of Example 1 except that the buffer layer had a two-layered structure of a CuPc layer and an $Alq_3$ layer, layered in that order from the side near an evaporated layer of Al (first upper conductive layer), instead of a single layer of CuPc.

Figure 7:
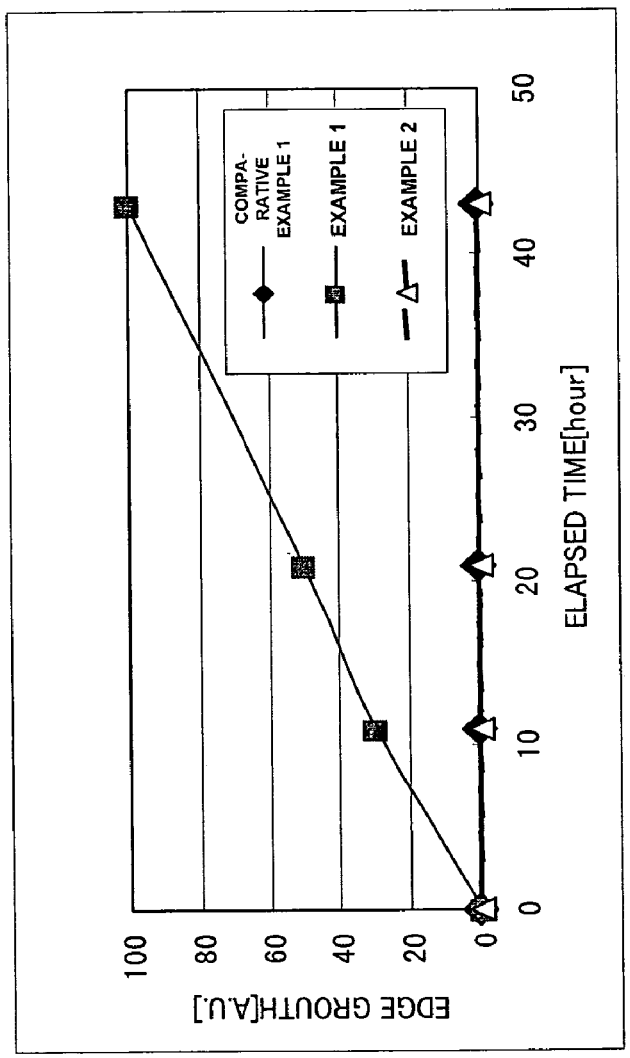
FIG. 7 is a diagram showing an evaluation of stability of an electroluminescence element according to a preferred embodiment of the present invention, in terms of edge growth with respect to elapsed time.

FIG. 7 shows results of an evaluation of stability of the organic EL elements of Examples 1 and 2 and Comparative Example 1, in terms of edge growth with respect to elapsed time (hours), that is, the degree of growth of film peeling in the element in an arbitrary unit, when the elements were placed under a temperature of 85° C. and a humidity of 85%. As is clear from FIG. 7, the film peeling in Example 2 in which a two-layer structured buffer layer was used and in Comparative Example 1 were 0 even after 43 hours, but in the element of Example 1, film peeling started to occur immediately after the evaluation test was started and reached 100 after 43 hours. From this result, it can be seen that, from the viewpoint of improvement of physical durability of the element, a single layer of a CuPc layer is not sufficient as the buffer layer to be formed as a part of the upper electrode between the evaporated layer and the sputtered layer, and it is desirable to employ a layered structure of at least a CuPc layer and an $Alq_3$ layer from the side near the evaporated layer of Al.

Figure 8:
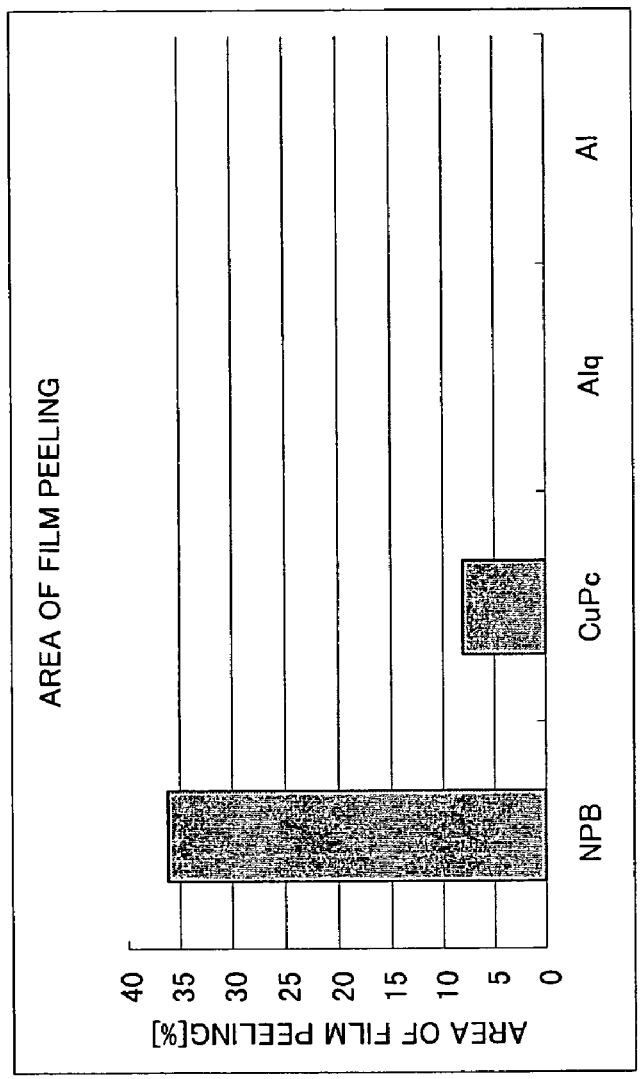
FIG. 8 is a diagram comparing moisture resisting capabilities of organic buffer layers and upper electrode material layers.

FIG. 8 shows a degree of film peeling after glass substrates were left for 20 hours under a high temperature and high humidity environment (85° C. and humidity of 85%), wherein, on the glass substrates, an NPB layer, a CuPc layer, an $Alq_3$ layer, and an Al (sputtered) layer was formed respectively. Among the layers formed on the glass substrates, after 20 hours, peeling occurred in 36% of the layer area in the NPB layer and in 8% of the layer area in the CuPc layer. However, no peeling occurred in the $Alq_3$ layer and in the Al layer.

From these results, it can be seen that, among the four materials, the moisture resisting capabilities of the films satisfied the following relationship: Al, $Alq_3$>CuPc>>NPB. Therefore, under a condition of high temperature and high humidity, when the second upper conductive layer is made of a sputtered layer of Al which almost does not absorb moisture, it is possible to reliably prevent peeling of the Al layer and $Alq_3$ layer by employing $Alq_3$ for the buffer layer in contact with the second upper conductive layer (it can also be understood that it is better to use CuPc than to use NPB as the buffer layer contacting the second upper conductive layer)

[Periphery of Panel]

Figure 9:
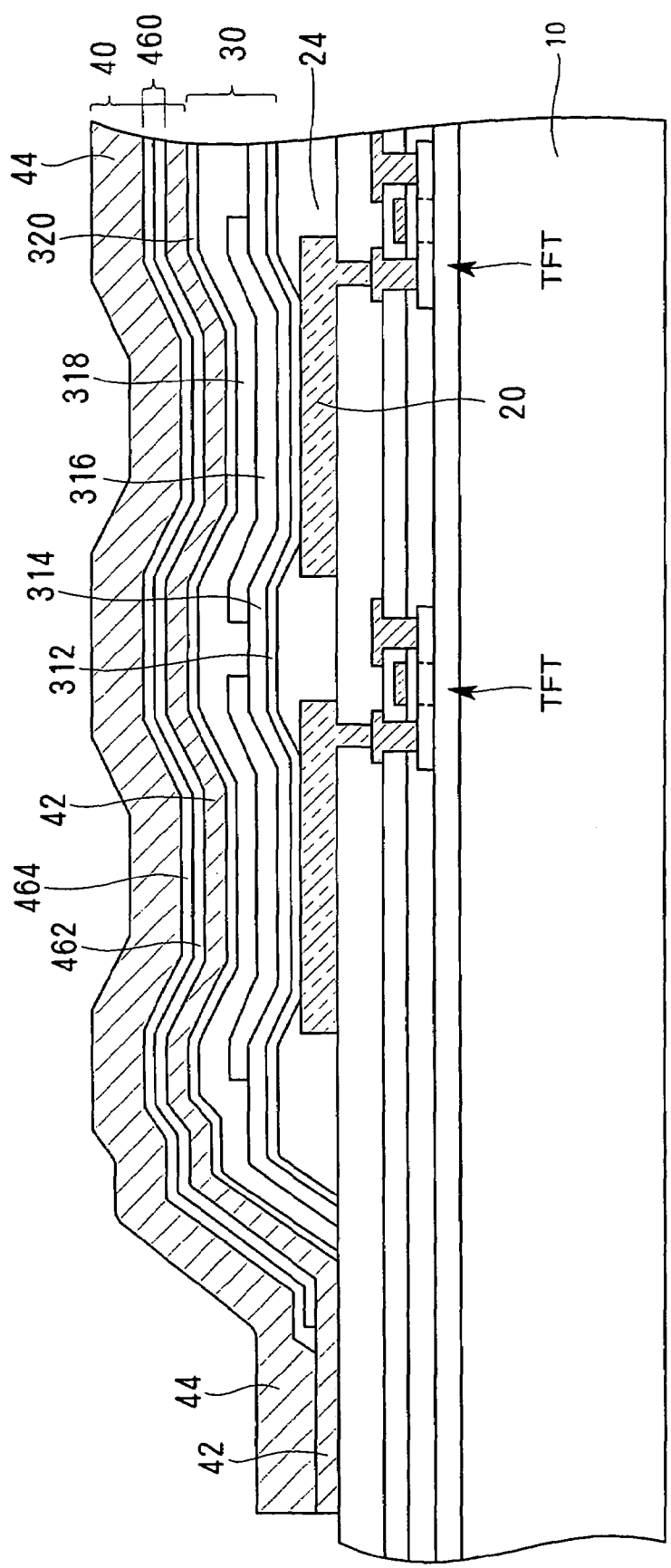
FIG. 9 is a diagram showing a structure of a periphery section of a panel having electroluminescence elements according to a preferred embodiment of the present invention.
Figure 10:
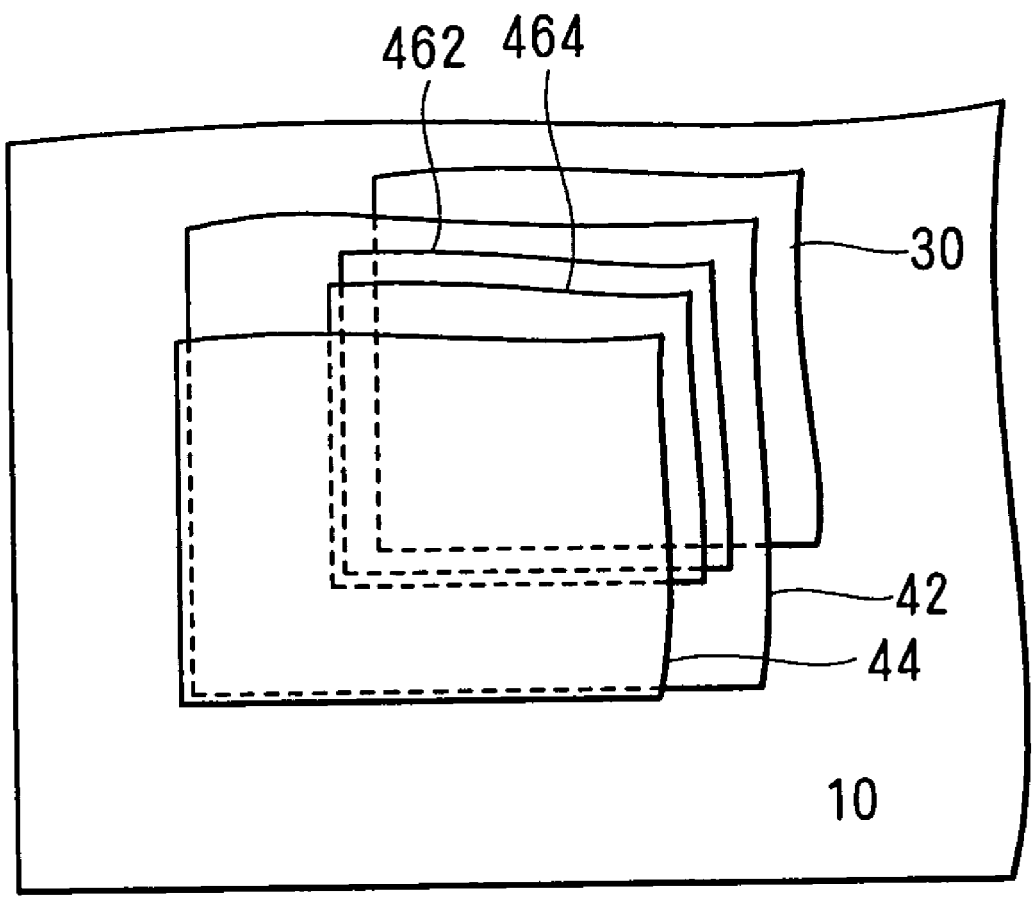
FIG. 10 is a diagram schematically showing a planar structure of a periphery section of a panel having electroluminescence elements according to a preferred embodiment of the present invention.

Next, a structure of the periphery (peripheral area) of an electroluminescence panel according to the present embodiment will be described. FIGS. 9 and 10 respectively show a schematic cross sectional structure and a planar structure of the panel periphery. FIG. 9 schematically shows a cross sectional structure of a periphery portion of an organic EL panel having a multi-layer structured buffer layer 460 as shown in FIG. 4. The buffer layer may alternatively be formed in a single layer as shown in FIGS. 2 and 3, in which case, the structure of the panel periphery would be as shown in FIG. 9 except that the buffer layer is a single layer.

The organic material used in the light emitting element layer of an organic El element is known to degrade by moisture or oxygen. In order to prevent entrance of moisture or oxygen into the light emitting element layer, it is necessary to increase a degree of isolation from the lower electrode side and from the upper electrode side and to prevent entrance of moisture and oxygen from a side surface of the element, in particular, from a side surface of the light emitting element layer at the panel periphery.

In the organic EL element of the present embodiment, a layered structure including a first upper conductive layer formed through evaporation, a buffer layer, and a second upper conductive layer formed through sputtering is employed as the upper electrode. As described above in Evaluation Example 2, a material of high moisture resistance is used in all layers. Therefore, in the present embodiment, the layers forming the upper electrode are formed extending to a position external to the formation region of the light emitting element layer at the panel periphery so that the side surface of the end portion of the light emitting element layer is covered by the upper electrode layer.

In an active matrix panel in which an organic EL element and a switching element such as a TFT for controlling light emission in the organic EL element are provided in each pixel, as shown in FIG. 9, the lower electrode 20 of the organic EL element to be connected to the TFT is formed in an individual pattern for each pixel. In addition, because the insulation between the lower electrode 20 and the upper electrode 40 (electrode 50 in FIG. 3) is not sufficient with the thin light emitting element layer 30 alone, end portions of the lower electrode 20 are covered by a planarizing insulating layer 24 made of an insulating resin or the like so that the lower electrode 20 and the upper electrode 40 are reliably insulated between pixels and at the pixel edge portion by the planarizing insulating layer 24.

In the display portion of the panel, the ends of the lower electrode 20 of a pixel located at the outermost position are also covered by the planarizing insulating layer 24. In the illustrated structure, the layers of the light emitting element layer 30 other than the emissive layer 316 (that is, layers 312, 314, 318, and 320) are formed extending over the planarizing insulating layer 24 and common to all pixels and are formed at the end portion of the display portion at least to a position over the planarizing insulating layer 24. Alternatively, one or more layers or all layers other than the emissive layer 316 may be formed in a pattern independent for each pixel depending on the characteristics of the organic EL element and/or organic materials to be used. In either case, the light emitting element layer 30 is formed to a position near an end of the display portion in which pixels are placed, and therefore, there is a high probability that moisture or the like may enter the light emitting element layer 30 from the outside near the end of the display portion.

In the present embodiment, after the light emitting element layer 30 is formed, a vacuum evaporated layer such as Al is formed as the first upper conductive layer 42. In a top emission organic EL element as shown in FIG. 3, a vacuum evaporated layer of Ag or the like is formed as the first upper conductive layer 52. During the period when the first upper conductive layer 42 is being formed through evaporation, a metal mask or the like having an opening extending to positions external to the formation area of the light emitting element layer 30 is used. With this configuration, a first upper conductive layer 42 is formed covering the ends of the light emitting element layer 30 in a display region, as shown in FIGS. 9 and 10.

Next, a first buffer layer 462 and a second buffer layer 464 are sequentially formed over the first upper conductive layer 42 through evaporation using the same mask (or a mask having the same opening pattern). During formation of the buffer layer, a mask having a smaller opening pattern than that of the mask for the first upper conductive layer 42 is used. Therefore, the buffer layer 460 ends at a position closer to the center than the ends of the first upper conductive layer 42. When Alq$_3$ is used for the second buffer layer 464 as described above, because the second buffer layer 464 made of Alq$_3$ is superior in the moisture resistance than the first buffer layer 462 for which CuPc is used, it is desirable to form the second buffer layer 464 to cover the ends of the first buffer layer 462, that is, to form the second buffer layer 464 larger than the first buffer layer 462.

In order to form the second buffer layer 464 to a larger area than that of the first buffer layer 462, it is possible to use a mask with a larger opening pattern than the mask for the first buffer layer 462. Alternatively, it is also possible to form the second buffer layer 464 in a larger area than that of the first buffer layer 462 using the same mask (same opening pattern) as that of the first buffer layer 462.

When one mask is to be re-used, it is possible to set, when the second buffer layer 464 is formed, the position of the mask provided between an evaporation source and the substrate in a vacuum evaporation chamber to a position nearer to the side of the evaporation source, that is, further away from the substrate, than when the first buffer layer 462 is formed. With either a point evaporation source or a linear evaporation source, because the material to be evaporated flies from the evaporation source at some angle to the normal of the evaporation source, it is possible to form an evaporated layer with a larger pattern on the substrate when the mask is provided further away from the substrate. In order to reduce the manufacturing cost involved in increasing the number of layers, it is desirable to use a mask common to various processes as much as possible. Therefore, from the viewpoint of reduction of manufacturing cost, it is desirable to form the second buffer layer 464 covering the ends of the first buffer layer 462 by using the same mask and adjusting the mask position from the substrate as described above.

After the buffer layer 460 is formed, the second upper conductive layer 44 is formed through sputtering in a pattern which is larger than the buffer layer 460 and approximately the same size as the first upper conductive layer 42 which is already formed. By ending the buffer layer 460 at a position internal to the ending position of the first and second upper conductive layers 42 and 44, it is possible to make the first upper conductive layer 42 and the second upper conductive layer 44 to directly contact each other at the periphery of the panel.

Therefore, even when a structure is employed in which a buffer layer 460 made of an organic metal complex material which has a charge transporting characteristics, but also has a relatively higher resistivity compared to a metal material, is inserted between the first upper conductive layer 42 and the second upper conductive layer 44, it is possible to supply sufficient electric power to the first upper conductive layer 42 for injecting charges (in the illustrated configuration, electrons) to the light emitting element layer 30. The first upper conductive layer 42 and the second upper conductive layer 44 are connected to an external power supply (Vc) (not shown) through a terminal formed on the panel.

It is necessary that the buffer layer 460 is formed completely covering at least the region in which the light emitting element layer 30 is formed below and above the end portion of the formation region of the light emitting element layer 30, in order to protect both the first upper conductive layer 42 and the light emitting element layer 30 below the buffer layer 460. As shown in FIGS. 9 and 10, near the ends of the display portion in which the light emitting element layer 30 is not present below, it is possible to ensure electrical connection between the first upper conductive layer 42 and the second upper conductive layer 44 even without the buffer layer 460 and with the first upper conductive layer 42 exposed to the sputtering film formation environment for the second upper conductive layer. Therefore, at the panel periphery, the buffer layer 460 can be ended at a position internal to the ending position of the first upper conductive layer 42 and of the second upper conductive layer 44. The contact distance between the first upper conductive layer 42 and the second upper conductive layer 44 may be, for example, approximately 300 μm to allow sufficient electrical contact and, with such a configuration, the buffer layer 460 may be ended at a position approximately 300 μm internal from the ending position of the first upper conductive layer 42.

In FIG. 9, a peripheral structure of a panel having a bottom emission organic EL element is illustrated. However, the present embodiment is not limited to such a structure and may be applied to a top emission organic EL panel as shown in FIG. 3. In such a configuration, at the periphery of the panel, the buffer layer 56 is formed in a smaller pattern than those of the first upper conductive layer 52 formed through evaporation and the second upper conductive layer 54 formed through sputtering and which is made of ITO or the like, such that the first upper conductive layer 52 and the second upper conductive layer 54 contact each other at the panel periphery and all components of the upper electrode 50 cover the end portion of the light emitting element layer 30, to achieve similar advantages.

The present invention has been described referring to an active matrix organic EL panel in which a switching element is provided in each pixel, but the upper electrode structure and the panel periphery structure of the present embodiment may also be applied to a passive matrix panel in which each pixel does not have a switching element, to achieve similar advantages.

In the organic EL element according to the above-described embodiments, the lower electrode 20 functions as the anode and the upper electrodes 40, 50, and 60 function as the cathode. However, the present invention is not limited to such a structure and may be applied to a structure in which the lower electrode functions as a cathode and the upper electrode functions as an anode. In such a case, the light emitting element layer 30 maybe be formed in a layered structure having, for example, an electron injection layer, an electron transport layer, an emissive layer, a hole transport layer, and a hole injection layer layered from the side near the lower layer.

What is claimed is:

1. An electroluminescence element having a light emitting element layer containing a light emitting material between a lower electrode and an upper electrode, wherein
the upper electrode comprises a first upper conductive layer formed through evaporation and a second upper conductive layer formed through sputtering, layered from a side near the light emitting element layer, and
a buffer layer for protecting at least the first upper conductive layer positioned below the buffer layer is provided between the first upper conductive layer and the second upper conductive layer;
wherein the buffer layer has a multi-layered structure comprising a plurality of evaporated layers of organic materials including an organic metal complex compound.

2. An electroluminescence element according to claim 1, wherein
the buffer layer has a distortion buffering function for preventing transfer of a distortion which occurs in the second upper conductive layer to the first upper conductive layer.

3. An electroluminescence element according to claim 1, wherein
the first upper conductive layer has a co-evaporated region of a metal material and an electron injection material used in an electron injection layer of the light emitting element layer, at least on a side of the first upper conductive layer near the light emitting element layer.

4. An electroluminescence element according to claim 1, wherein
the multi-layer structured buffer layer comprises a first buffer layer and a second buffer layer provided between the first buffer layer and the second upper conductive layer, wherein a material of the second buffer layer has a higher moisture resistance than a material of the first buffer layer.

5. An electroluminescence element according to claim 1, wherein
the buffer layer comprises a first buffer layer containing a copper phthalocyanine complex derivative compound and a second buffer layer containing a aluminum-quinolinol complex derivative compound.

6. An electroluminescence element according to claim 5, wherein
the second buffer layer is formed between the first buffer layer and the second upper conductive layer.

7. An electroluminescence element according to claim 1, wherein
the first upper conductive layer and the second upper conductive layer contain aluminum, and
the buffer layer contains a copper phthalocyanine complex derivative compound.

8. An electroluminescence element according to claim 7, wherein
the light emitting element layer further comprises a layer containing a benzidine derivative compound having a hole transport functionality.

9. An electroluminescence element having a light emitting element layer containing a light emitting material between a lower electrode and an upper electrode, wherein
the upper electrode comprises a first upper conductive layer formed through evaporation and a second upper conductive layer formed through sputtering, layered from a side near the light emitting element layer;
a buffer layer for protecting at least the first upper conductive layer positioned below the buffer layer is provided between the first upper conductive layer and the second upper conductive layer; and
the buffer layer has a multi-layer structure of a plurality of layers, each of which is an evaporated layer, wherein a buffer material of at least one layer in the multi-layer structure differs from a buffer material of the other layers;
wherein the buffer layer comprises a first buffer layer containing a copper phthalocyanine complex derivative compound and a second buffer layer containing an aluminum-quinolinol complex derivative compound.

10. An electroluminescence element according to claim 9, wherein
the multi-layer structured buffer layer comprises a first buffer layer and a second buffer layer provided between the first buffer layer and the second upper conductive layer, wherein a material of the second buffer layer has a higher moisture resistance than the material of the first buffer layer.

11. An electroluminescence element according to claim 9, wherein
the second buffer layer is formed between the first buffer layer and the second upper conductive layer.

12. An electroluminescence element according to claim 9, wherein
the first upper conductive layer and the second upper conductive layer contain aluminum.

13. An electroluminescence element according to claim 12, wherein
the light emitting element layer further comprises a layer containing a benzidine derivative compound having a hole transport functionality.

14. An electroluminescence element having a light emitting element layer containing a light emitting material between a lower electrode and an upper electrode, wherein
a charge injection layer is formed on a side of the light emitting element near a contact interface with the upper electrode;
the upper electrode comprises a first upper conductive layer formed through evaporation and a second upper conductive layer formed through sputtering, layered from a side near the charge injection layer of the light emitting element layer; and
a buffer layer for protecting the first upper conductive layer and layers below the first upper conductive layer is provided between the first upper conductive layer and the second upper conductive layer, wherein
the charge injection layer is an electron injection layer for lowering an electron injection barrier;
the first upper conductive layer is an optically semi-transmissive metal layer;
the buffer layer is an evaporated layer of an organic material containing an organic metal complex compound; and
the second upper conductive layer contains a transparent conductive metal oxide material.

15. An electroluminescence element according to claim 14, wherein
the buffer layer has a distortion buffering function for preventing transfer of a distortion which occurs in the second upper conductive layer to the first upper conductive layer.

16. An electroluminescence element according to claim 14, wherein
the first upper conductive layer has a co-evaporated region of a metal material and an electron injection material used in an electron injection layer of the light emitting element layer, at least on the side of the first upper conductive layer near the light emitting element layer.

17. An electroluminescence element having a light emitting element layer containing a light emitting material between a lower electrode and an upper electrode, wherein
a charge injection layer is formed on a side of the light emitting element near a contact interface with the upper electrode;
the upper electrode comprises a first upper conductive layer formed through evaporation and a second upper conductive layer formed through sputtering, layered from a side near the charge injection layer of the light emitting element layer; and
a buffer layer for protecting the first upper conductive layer and layers below the first upper conductive layer is provided between the first upper conductive layer and the second upper conductive layer, wherein
the buffer layer has a multi-layered structure comprising a plurality of evaporated layers of organic materials including an organic metal complex compound.

18. An electroluminescence element having a light emitting element layer containing a light emitting material between a lower electrode and an upper electrode, wherein
a charge injection layer is formed on a side of the light emitting element near a contact interface with the upper electrode;
the upper electrode comprises a first upper conductive layer formed through evaporation and a second upper conductive layer formed through sputtering, layered from a side near the charge injection layer of the light emitting element layer; and
a buffer layer for protecting the first upper conductive layer and layers below the first upper conductive layer is provided between the first upper conductive layer and the second upper conductive layer, wherein
the buffer layer has a multi-layer structure of a plurality of layers, each of which is an evaporated layer, wherein a buffer material of at least one layer in the multi-layer structure differs from a buffer material of the other layers.

19. An electroluminescence element according to claim 18, wherein
the multi-layer structured buffer layer comprises a first buffer layer and a second buffer layer provided between the first buffer layer and the second upper conductive layer, wherein a material of the second buffer layer has a higher moisture resistance than a material for the first buffer layer.

20. An electroluminescence element according to claim 18, wherein
the buffer layer comprises a first buffer layer containing a copper phthalocyanine complex derivative compound and a second buffer layer containing an aluminum-quinolinol complex derivative compound.

21. An electroluminescence element according to claim 20, wherein
the second buffer layer is formed between the first buffer layer and the second upper conductive layer.

22. An electroluminescence panel comprising a plurality of electroluminescence elements in a display region, each of the electroluminescence element having a light emitting element layer containing a light emitting material between a lower electrode and an upper electrode, wherein
the upper electrode of the electroluminescence element comprises a first upper conductive layer formed through evaporation and a second upper conductive layer formed through sputtering, layered from a side near the light emitting element layer;
a buffer layer is provided between the first upper conductive layer and the second upper conductive layer;
each layer of the upper electrode is formed covering an end portion of the light emitting element layer and extending to a position external to the position of the light emitting element layer in a periphery portion of the display region; and
the buffer layer ends at a position internal to an ending position of the first upper conductive layer and the second upper conductive layer so that the first upper conductive layer and the second upper conductive layer contact each other near the ending position.

23. An electroluminescence panel according to claim 22, wherein
the buffer layer has a multi-layer structure of a plurality of layers, wherein a buffer material of at least one layer in the multi-layer structure differs from a buffer material of the other layers.

24. An electroluminescence panel according to claim 23, wherein
the buffer layer comprises a first buffer layer containing a copper phthalocyanine complex derivative compound and a second buffer layer containing an aluminum-quinolinol complex derivative compound;
the second buffer layer is formed between the first buffer layer and the second upper conductive layer, and
the second buffer layer extends to a position external to an ending position of the first buffer layer at a periphery of the display region to cover an end portion of the first buffer layer.

25. An electroluminescence panel according to claim 22, wherein
the buffer layer is an evaporated layer having a material with measurable resistance to at least one of sputtering or plasma.

26. An electroluminescence panel according to claim 25, wherein
the buffer layer has a multi-layer structure of a plurality of layers, wherein a buffer material of at least one layer in the multi-layer structure differs from a buffer material of the other layers.

27. An electroluminescence panel according to claim 26, wherein
the buffer layer comprises a first buffer layer containing a copper phthalocyanine complex derivative compound and a second buffer layer containing an aluminum-quinolinol complex derivative compound;
the second buffer layer is formed between the first buffer layer and the second upper conductive layer, and
the second buffer layer extends to a position external to an ending position of the first buffer layer at a periphery of the display region to cover an end portion of the first buffer layer.

28. An electroluminescence panel according to claim 22, wherein
the first upper conductive layer and the second upper conductive layer contain aluminum, and
the buffer layer contains a copper phthalocyanine complex derivative compound.

29. An electroluminescence panel according to claim 28, wherein
the light emitting element layer further comprises a layer containing a benzidine derivative compound having a hole transport functionality.

* * * * *